US008217397B2

United States Patent
Ochi et al.

(12) United States Patent
(10) Patent No.: US 8,217,397 B2
(45) Date of Patent: Jul. 10, 2012

(54) THIN FILM TRANSISTOR SUBSTRATE AND DISPLAY DEVICE

(75) Inventors: Mototaka Ochi, Kobe (JP); Nobuyuki Kawakami, Kobe (JP); Katsufumi Tomihisa, Kobe (JP); Hiroshi Goto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 56 days.

(21) Appl. No.: 12/812,913

(22) PCT Filed: Jan. 15, 2009

(86) PCT No.: PCT/JP2009/050482
§ 371 (c)(1),
(2), (4) Date: Jul. 14, 2010

(87) PCT Pub. No.: WO2009/091004
PCT Pub. Date: Jul. 23, 2009

(65) Prior Publication Data
US 2010/0295053 A1    Nov. 25, 2010

(30) Foreign Application Priority Data
Jan. 16, 2008  (JP) ................... 2008-007221

(51) Int. Cl.
H01L 27/14    (2006.01)
H01L 29/04    (2006.01)
H01L 29/15    (2006.01)
H01L 31/036   (2006.01)

(52) U.S. Cl. ...... 257/72; 257/59; 257/771; 257/E33.013

(58) Field of Classification Search ............. 257/59, 257/72, 771, E33.013
See application file for complete search history.

(56) References Cited

U.S. PATENT DOCUMENTS
5,514,909 A    5/1996 Yamamoto et al.
(Continued)

FOREIGN PATENT DOCUMENTS
CN    1917218 A    2/2007
(Continued)

OTHER PUBLICATIONS

Office Action issued Sep. 26, 2011, in Chinese Patent Application No. 200980101632.4 with English translation.

*Primary Examiner* — Jarrett Stark
(74) *Attorney, Agent, or Firm* — Oblon, Spivak, McClelland, Maier & Neustadt, L.L.P.

(57) ABSTRACT

The present invention provides a thin film transistor substrate and a display device in which a decrease in the dry etching rate of a source electrode and drain electrode is not caused; no etching residues are generated; and a barrier metal can be eliminated between a semiconductor layer and metal wires such as the source and drain electrodes. The present invention is a thin film transistor substrate having a semiconductor layer 1, a source electrode 2, a drain electrode 3, and a transparent conductive film 4, in which the source electrode 2 and drain electrode 3 are formed by patterning by means of dry etching and comprises an Al alloy thin film comprising 0.1 to 1.5 atom % of Si and/or Ge, 0.1 to 3.0 atom % of Ni and/or Co, and 0.1 to 0.5 atom % of La and/or Nd, and the thin film transistor is directly connected with the semiconductor layer 1.

15 Claims, 3 Drawing Sheets

U.S. PATENT DOCUMENTS

| | | | |
|---|---|---|---|
| 6,033,542 | A | 3/2000 | Yamamoto et al. |
| 6,096,438 | A | 8/2000 | Takagi et al. |
| 6,218,206 | B1 | 4/2001 | Inoue et al. |
| 6,252,247 | B1 | 6/2001 | Sakata et al. |
| 6,292,241 | B1 | 9/2001 | Hirano |
| 6,514,804 | B1 | 2/2003 | Yamaguchi |
| 7,098,539 | B2 | 8/2006 | Gotoh et al. |
| 7,154,180 | B2 | 12/2006 | Gotoh et al. |
| 7,262,085 | B2 | 8/2007 | Gotoh et al. |
| 7,365,810 | B2 | 4/2008 | Gotoh et al. |
| 7,411,298 | B2 | 8/2008 | Kawakami et al. |
| 7,553,754 | B2 | 6/2009 | Gotoh et al. |
| 7,622,809 | B2 | 11/2009 | Gotoh et al. |
| 7,683,370 | B2 | 3/2010 | Kugimiya et al. |
| 2003/0047812 | A1 | 3/2003 | Hagihara et al. |
| 2004/0126608 | A1 | 7/2004 | Gotoh et al. |
| 2005/0118811 | A1 | 6/2005 | Murata |
| 2005/0224795 | A1 | 10/2005 | Gotoh et al. |
| 2006/0007366 | A1 | 1/2006 | Gotoh et al. |
| 2006/0091792 | A1 | 5/2006 | Kugimiya et al. |
| 2006/0180250 | A1 | 8/2006 | Kugimiya et al. |
| 2006/0275618 | A1 | 12/2006 | Kugimiya et al. |
| 2007/0040173 | A1 | 2/2007 | Kugimiya et al. |
| 2007/0278497 | A1* | 12/2007 | Kawakami et al. ............ 257/79 |
| 2008/0081532 | A1 | 4/2008 | Okuno |
| 2008/0121522 | A1 | 5/2008 | Ehira et al. |
| 2008/0223718 | A1 | 9/2008 | Takagi et al. |
| 2008/0315203 | A1 | 12/2008 | Hino et al. |
| 2009/0001373 | A1 | 1/2009 | Ochi et al. |
| 2009/0004490 | A1 | 1/2009 | Gotou et al. |
| 2009/0011261 | A1 | 1/2009 | Gotou et al. |
| 2009/0026072 | A1 | 1/2009 | Takagi et al. |
| 2009/0133784 | A1 | 5/2009 | Kugimiya et al. |
| 2009/0176113 | A1 | 7/2009 | Gotoh et al. |
| 2009/0242394 | A1 | 10/2009 | Takagi et al. |
| 2010/0012935 | A1 | 1/2010 | Hino et al. |
| 2010/0032186 | A1 | 2/2010 | Gotou et al. |
| 2010/0065847 | A1 | 3/2010 | Gotou et al. |
| 2010/0163877 | A1 | 7/2010 | Hino et al. |

FOREIGN PATENT DOCUMENTS

| | | |
|---|---|---|
| JP | 07045555 | 2/1995 |
| JP | 10 48669 | 2/1998 |
| JP | 11 283934 | 10/1999 |
| JP | 11 284195 | 10/1999 |
| JP | 11 337976 | 12/1999 |
| JP | 2001 36095 | 2/2001 |
| JP | 2003 273109 | 9/2003 |
| JP | 2004 55842 | 2/2004 |
| JP | 2004 151598 | 5/2004 |
| JP | 2004 214606 | 7/2004 |
| JP | 2005 171378 | 6/2005 |
| JP | 2005 303003 | 10/2005 |
| JP | 2006 23388 | 1/2006 |
| JP | 2007 81385 | 3/2007 |

* cited by examiner

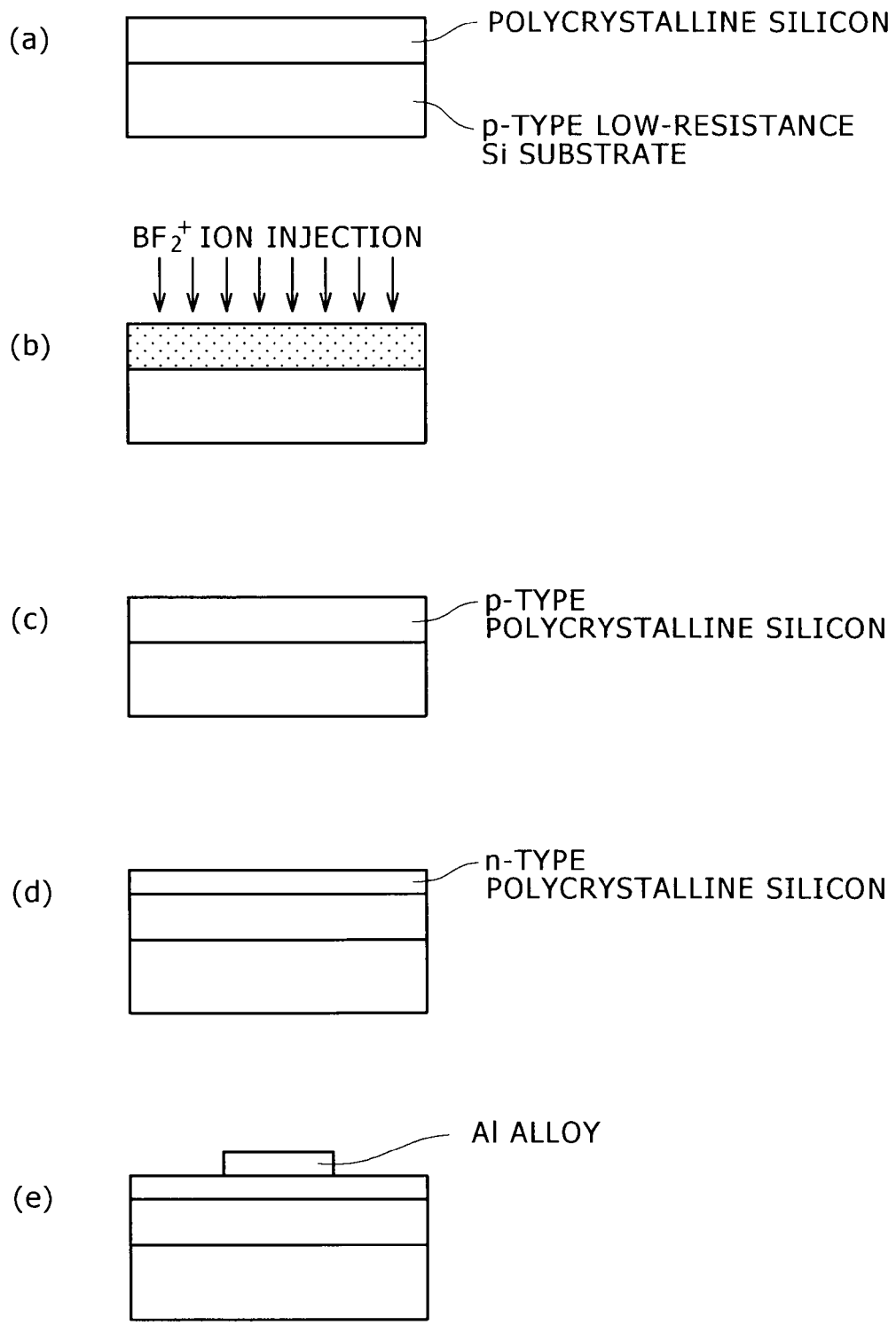

THIN FILM TRANSISTOR SUBSTRATE AND DISPLAY DEVICE

TECHNICAL FIELD

The present invention relates to the technical field of thin film transistor substrates and display devices.

BACKGROUND ART

Active matrix-type liquid crystal display devices such as LCD uses thin film transistors: Thin film transistor (hereinafter also referred to as TFTs.) as switching elements. A schematic cross-sectional view of the TFT element is shown in FIG. 1. The TFT element comprises a gate electrode 6 formed on a glass substrate 5, a non-doped semiconductor layer 1a provided on the electrode 6 via a gate insulating film 7, and an impurity-doped semiconductor silicon layer 1b which is in contact with the non-doped semiconductor silicon layer 1a. The non-doped semiconductor silicon layer 1a and the impurity-doped semiconductor silicon layer 1b are collectively referred to as a semiconductor layer 1. This impurity-doped semiconductor silicon layer 1b is electrically connected by a metal wire of Al alloy or others. These metal wires are referred to as a source electrode 2 and a drain electrode 3. A transparent conductive film 4 used in the liquid crystal display unit is further connected to the drain electrode 3.

Various Al alloys have been heretofore suggested as materials used for these source electrode and drain electrode, as in patent documents 1 and 2, among others. The source electrodes and drain electrodes described in these prior art documents have a multilayer film comprising high-melting-point metal such as Mo, Cr, Ti and W interposed therebetween as a barrier metal so that they do not come in direct contact with the transparent conductive film (hereinafter also referred to as ITO film.) used for semiconductor layers and liquid crystal display units.

Various techniques of eliminating a barrier metal existing between the drain electrode and transparent conductive film (ITO film) have been suggested, for example, in patent documents 3, 4 and 5, among others. However, techniques for eliminating the barrier metal provided between the source electrode or drain electrode and the semiconductor layer of the thin film transistor have not been discussed sufficiently. Moreover, for active matrix type liquid crystal display devices, requirement for refinement mainly in mobile applications is high, and micromachining (in particular dry etching) of metal wires such as source electrodes and drain electrodes are highly required. However, this aspect has not yet been discussed sufficiently.

[Patent document 1] Japanese Unexamined Patent Publication No. 1995-45555
[Patent document 2] Japanese Unexamined Patent Publication No. 2005-171378
[Patent document 3] Japanese Unexamined Patent Publication No. 2004-214606
[Patent document 4] Japanese Unexamined Patent Publication No. 2005-303003
[Patent document 5] Japanese Unexamined Patent Publication No. 2006-23388

DISCLOSURE OF THE INVENTION

Problem to be Solved by the Invention

In recent years, while the size of panels in LCDs (LCD) becomes larger, requirement for refinement of the panels is growing, and refinement of LCDs, that is, the reduction in wire width of Al alloy thin films such as source electrodes and drain electrodes is also expected. Presently, the wire width of the Al alloy thin film has been reduced to about 3.0 µm at the smallest, and it is expected to be further reduced to about 1.5 µm in a few years. It is important to employ submicron control called CD (Critical Dimension) control for this reduction of the wire width of the Al alloy thin film. By conducting dry etching using plasma in place of wire patterning by the conventional wet etching, a technique for etching exactly as the wire width set by the mask becomes essentially necessary.

As a halogen gas used in dry etching of Al alloy, fluorine cannot be used since compounds of Al and F (fluorine) are non-volatile, and an etchant gas comprising at least one element of chlorine ($Cl_2$), boron trichloride ($BCl_3$) and hydrogen bromide (HBr) is used.

Halogen radicals such as Cl dissociated by plasma react with Al on the surface of Al alloy, which is an object to be etched, to form base substances such as $AlCl_x$. These base substances such as $Alcl_x$ are evaporated in the gas phase due to the ion bombardment assist effect by the application of a bias to the substrate, and is discharged to the outside of the vacuum chamber in which the substrate is mounted. When the vapor pressure of the base substance produced is low, the etching rate is lowered, thereby lowering its throughput. Moreover, since the base substances formed on the surface of Al alloy remain without evaporating, etching residues (residues of etching generated during dry etching) are generated. Furthermore, in this aluminium etching, selectivity between aluminium and the resist is low, and therefore the film thickness of the resist needs to be increased to prevent a decrease in the etching rate. Since this lowers the resolving power in lithography, resolution of minute patterns is made difficult.

In active matrix-type liquid crystal display devices, as already mentioned, refinement is highly demanded mainly in mobile applications, and requirement for micromachining (especially dry etching) of the metal wires such as source electrodes and drain electrodes is increasing, but they have not been sufficiently studied yet. Although polycrystalline silicon TFTs have been drawing attention in mobile applications in recent years, polycrystalline silicon as a semiconductor layer of the thin film transistor, and techniques for removing a barrier metal from between the metal wires such as source electrodes and drain electrodes have not yet been studied sufficiently.

The present invention has been made in view of such present situations, and its object is to provide a thin film transistor substrate and a display device in which a decrease in the dry etching rate of the source electrode and drain electrode is not caused; no etching residues are generated; and a barrier metal can be eliminated from between the semiconductor layer of the thin film transistor and the metal wires such as the source electrode and drain electrode, and further to provide a thin film transistor substrate and a display device in which a barrier metal existing between the drain electrode and the transparent conductive film is also eliminated.

Means for Solving the Problem

[1] A thin film transistor substrate having a semiconductor layer of a thin film transistor, a source electrode, a drain electrode, and a transparent conductive film, the source electrode and drain electrode comprising a thin film of Al alloy formed by patterning by dry etching, the thin film of Al alloy comprising 0.1 to 1.5 atom % of at least one element selected from Si and Ge, 0.1 to 3.0 atom % of at least one element selected from Ni and Co, and 0.1 to 0.5 atom % of at least one element selected from La and Nd, the source electrode and drain electrode being directly connected with a semiconductor layer comprising polycrystalline silicon or continuous grain polycrystalline silicon.

[2] A thin film transistor substrate having a semiconductor layer of a thin film transistor, a source electrode, a drain electrode, and a transparent conductive film, the source electrode and drain electrode comprising a thin film of Al alloy formed by patterning by dry etching, the thin film of Al alloy comprising 0.1 to 1.5 atom of at least one element selected from Si and Ge, 0.1 to 6.0 atom % of at least one element selected from Ni and Co, and 0.1 to 0.35 atom of at least one element selected from La and Nd, the source electrode and drain electrode being directly connected with a semiconductor layer comprising polycrystalline silicon or continuous grain polycrystalline silicon.

[3] A thin film transistor substrate having a semiconductor layer of a thin film transistor, a source electrode, a drain electrode, and a transparent conductive film, the source electrode and drain electrode comprising a thin film of Al alloy formed by patterning by dry etching, the thin film of Al alloy comprising 0.1 to 2.0 atom % of at least one element selected from Si and Ge, 0.1 to 2.0 atom % of at least one element selected from Ni and Co, 0.1 to 0.25 atom % of at least one element selected from La and Nd, and the source electrode and drain electrode being directly connected with a semiconductor layer comprising polycrystalline silicon or continuous grain polycrystalline silicon.

[4] A thin film transistor substrate according to anyone of [1] to [3], wherein the drain electrode is further directly connected with the transparent conductive film.

[5] A thin film transistor substrate according to anyone of [1] to [4], wherein the source electrode and drain electrode are formed by sputtering.

[6] A thin film transistor substrate according to any one of [1] to [5], wherein the source electrode and drain electrode is formed by dry etching using an etchant gas comprising at least one gas selected from chlorine ($Cl_2$), boron trichloride ($BCl_3$), and hydrogen bromide (HBr).

[7] A thin film transistor substrate according to [6], wherein the source electrode and the drain electrode are formed during photolithography development prior to dry etching by being exposed to a tetramethylammonium hydroxide aqueous solution at the surfaces thereof.

[8] A display device comprising a thin film transistor substrate according to any one of [1] to [7].

Effects of the Invention

According to the present invention, a decrease in the dry etching rate of the source electrode and drain electrode is not caused; no etching residues are generated; and a barrier metal can be eliminated from between the semiconductor layer of the thin film transistor and the metal wires such as the source electrode and drain electrode. Moreover, a barrier metal existing between the drain electrode and the transparent conductive film can be also eliminated.

BRIEF DESCRIPTION OF THE DRAWINGS

FIG. 3 shows the production process of an element for evaluation (pn junction device) according to Example 2, in which (a) is a side view showing a state that a polycrystalline silicon film is formed on the p-type low-resistance Si substrate; (b) is a side view showing a state that BF ions are injected into the polycrystalline silicon film; (c) is a side view showing a state that the polycrystalline silicon film is converted into a p-type polycrystalline silicon film by heat treatment after the injection of BF ions; (d) is a side view showing a state that an n-type polycrystalline silicon film is formed on the p-type polycrystalline silicon film; and (e) is a side view showing an element for evaluation (pn junction device) produced by etching after an Al alloy film is formed on the n-type polycrystalline silicon film.

| Explanation of References | |
|---|---|
| 1 | Semiconductor layer |
| 2 | Source electrode |
| 3 | Drain electrode |
| 4 | Transparent conductive film |
| 5 | Glass substrate |
| 6 | Gate electrode |
| 7 | Gate insulating film |

BEST MODE FOR CARRYING OUT THE INVENTION

The present invention will be described below in further detail with reference to the embodiments shown in accompanying drawings.

Figure 1:
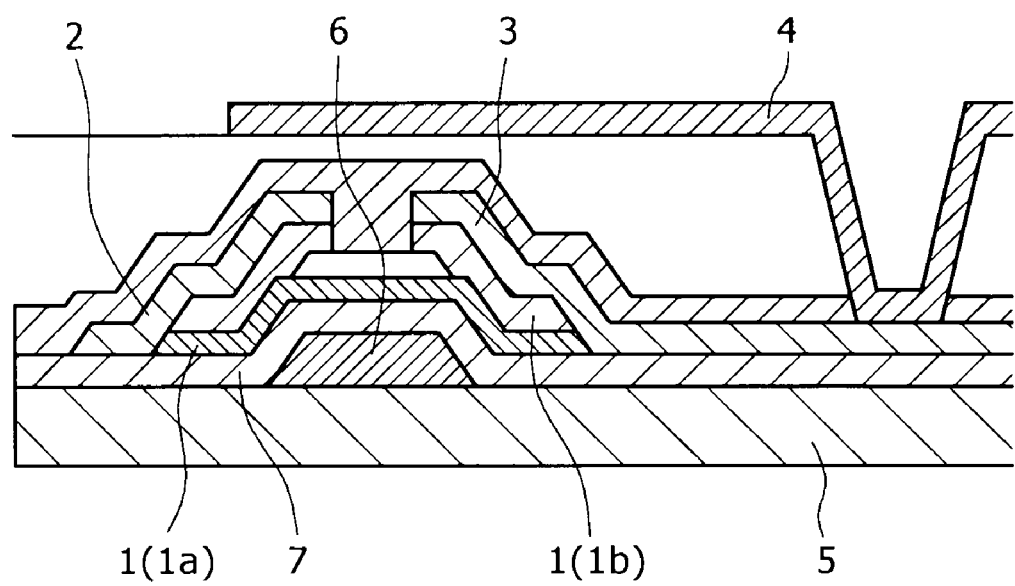
FIG. 1 is a vertical cross-sectional view showing a TFT element used in a liquid crystal display device.

First, the structure of the thin film transistor substrate of the present invention will be described with reference to FIG. 1. As already mentioned, in active matrix-type liquid crystal display devices such as liquid crystal displays, thin film transistors are used as switching elements. This TFT element is constructed of a gate electrode 6 formed on a glass substrate 5, a non-doped semiconductor silicon layer 1$a$ provided on the gate electrode 6 via a gate insulating film 7, and an impurity-doped semiconductor silicon layer 1$b$ which is in contact with a non-doped semiconductor silicon layer 1$a$. This non-doped semiconductor silicon layer 1$a$ and the impurity-doped semiconductor silicon layer 1$b$ are collectively referred to as a semiconductor layer 1. This impurity-doped semiconductor silicon 1$b$ layer is electrically connected by metal wires of Al alloy or others. These metal wires are referred to as a source electrode 2 and a drain electrode 3. A transparent conductive film 4 used in a liquid crystal display unit is further connected to the drain electrode 3.

The inventors of the present invention formed elements for evaluation using thin films prepared by adding various elements to Al, and determined the interdiffusion of Al/Si (interdiffusion of Al atoms and Si atoms), electric resistivity and hillock resistance thereof. Accordingly, the inventors found that it was effective for achieving the characteristics mentioned above to add Si and/or Ge to Al, further add Ni and/or Co, and then Add La and/or Nd thereto.

It is known that the addition of Si to Al improves the effect in suppressing the interdiffusion of Al and Si atoms as the amount of Si added increases. Meanwhile, when these are used singly (when only Si is added to Al), the upper limit of the temperature at which the interdiffusion of Al/Si can be suppressed is about 250° C. However, the inventors have found that if Ni is further added to an Al—Si alloy (Si is added to Al, and Ni is further added thereto) to prepare an Al alloy comprising Si and Ni, the interdiffusion of Al/Si can be suppressed at higher temperatures.

The mechanism of suppressing interdiffusion is supposedly as follows: to begin with, the effect of incorporating Si is to prevent Si atoms from diffusing from the semiconductor layer comprising Si as a main component into the Al thin film such as the source electrode and drain electrode. That is, by incorporating atoms similar to Si atoms into the Al thin film in advance, concentration difference, which is the driving force of diffusion, can be reduced. Moreover, a possible effect of incorporating Ni is the formation of a diffusion prevention layer at the interface between the Al alloy thin film and the Si semiconductor layer (Al alloy thin film/Si semiconductor layer interface). More specifically, It is presumed that Ni readily reacts with Si at low temperatures to form silicide, and once silicide is produced, the silicide layer acts as a barrier so that interdiffusion does not proceed anymore. The interdiffusion is possibly dramatically improved by these synergistic effects so that the interdiffusion of Al/Si can be suppressed at higher temperatures.

Using Ge which is an element having a similar effect, in place of or in combination with Si and Co which is an element having a similar effect, in place of or in combination with Ni can also achieve similar actions and effects.

While the interdiffusion of Al/Si can be suppressed at higher temperatures, a thin film comprising the Al—Si (Ge)—Ni (Co) alloy does not have sufficient hillock resistance. However, it was found that hillock resistance can be improved by further adding La and/or Nd to the Al—Si (Ge)—Ni(Co) alloy.

Since the drain electrode comprises the Al alloy having the component composition mentioned above, it can be connected directly to the transparent conductive film as well as to the semiconductor layer of the thin film transistor with no barrier metal interposed therebetween. This is mainly because the Al alloy comprises Ni or Co. That is, deposition of an intermetallic compound of Ni or Co at grain boundaries and within grains by heating presumably forms a conductive path at the interface between the compound and the transparent conductive film.

The source electrode and drain electrode need to be formed by the patterning of the Al alloy by means of photolithography and dry etching. In case the Al alloy having the component composition as mentioned above, chlorides in the produced Si (and/or Ge), Ni (and/or Co), La (and/or Nd) have a vapor pressure lower than $AlCl_x$, and therefore it is necessary to keep the amount of additive elements such as Si (and/or Ge), Ni (and/or Co) and La (and/or Nd) contained as low as possible.

Therefore, according to the present invention, the dry etching rate of the source electrode and drain electrode is not lowered, and the barrier metal between the semiconductor layer of the thin film transistor and the Al alloy such as the source electrode and drain electrode can be eliminated. That is, the semiconductor layer can be connected directly with the source electrode and drain electrode. Moreover, the barrier metal existing between the drain electrode and the transparent conductive film can be also eliminated. That is, the drain electrode and the transparent conductive film can be connected directly. In other words, a barrier metal need not be formed between these components, whereby minute wire patterning can be formed without lowering its throughput.

In the thin film transistor substrate of the present invention, the amount contained of additive elements such as Si and/or Ge, Ni and/or Co, La and/or Nd added to the Al alloy thin film forming the source electrode and drain electrode are as follows: Si and/or Ge: 0.1 to 1.5 atom %, Ni and/or Co: 0.1 to 3.0 atom %, La and/or Nd: 0.1 to 0.5 atom %. The reasons will be described below.

The reason why the amount of Si and/or Ge is 0.1 to 1.5 atom % is that when the amount of Si and/or Ge is lower than 0.1 atom %, the effect in suppressing the interdiffusion of Al/Si is lowered and the suppression of the interdiffusion of Al/Si becomes insufficient, while when the amount of Si and/or Ge is higher than 1.5 atom %, the dry etching rate is greatly lowered. The lower limit of the amount of Si and/or Ge contained is preferably 0.2 atom % or higher, and more preferably 0.3 atom % or higher, while the upper limit is preferably 0.8 atom % or lower, and more preferably 0.5 atom % or lower. The reason why the amount of Ni and/or Co is 0.1 to 3.0 atom % is that when the amount of Ni and/or Co is lower than 0.1 atom %, the effect in suppressing the interdiffusion of Al/Si is lowered and the suppression of the interdiffusion of Al/Si becomes insufficient, while when the amount of Ni and/or Co is higher than 3.0 atom %, the dry etching rate is greatly lowered. The lower limit of the amount of Ni and/or Co contained is preferably 0.2 atom % or higher, while the upper limit is preferably 2.0 atom % or lower, and more preferably 0.6 atom % or lower. The reason why the amount of La and/or Nd is 0.1 to 0.5 atom % is that when it is lower than 0.1 atom %, the effect in improving hillock resistance is lowered and therefore hillock resistance becomes insufficient, while it is higher than 0.5 atom %, the dry etching rate is greatly lowered. The upper limit of the amount of La and/or Nd contained is preferably 0.35 atom % or lower, and more preferably 0.2 atom % or lower.

However, when the amount of La and/or Nd contained is 0.1 to 0.35 atom % increasing the amount of Ni and/or Co contained to 6.0 atom %, preferably to 2.0 atom %, and more preferably to 1.0 atom % does not lower the dry etching rate, nor generate residues after the dry etching. Furthermore, when the amount of La and/or Nd contained is 0.1 to 0.25 atom % and the amount of Ni and/or Co contained is 0.1 to 2.0 atom %, increasing the amount of Si and/or Ge contained to 2.0 atom %, preferably to 1.5 atom %, and more preferably to 1.0 atom % does not lower the dry etching rate, nor generate residues after the dry etching.

The temperature at which the interdiffusion of Al/Si starts becomes even higher when the semiconductor layer is polycrystalline silicon, and therefore it is recommended that the semiconductor layer is made of polycrystalline silicon. Moreover, the present invention can be also applied to continuous grain polycrystalline silicon, as well as to polycrystalline silicon.

It is desirable that the Al alloy thin film forming the source electrode and drain electrode is formed by sputtering. That is, in forming the Al alloy thin films of the source electrode and drain electrode, the method of forming them is not especially limited, but is desirably conducted by employing sputtering. By employing sputtering, a desired component composition can be readily obtained by adjusting the composition of the target used.

The thin film transistor substrate according to the present invention can be used for various electronic devices. It can be used for, for example, thin film transistor substrates of display devices such as liquid crystal displays and organic EL disks.

EXAMPLES

Examples and Comparative Examples of the present invention will be described below. It should be noted that the present invention is not limited to Examples below, and can be carried out with appropriate modifications as long as they conform to the purport of the present invention, All of such modifications are included in the technical scope of the present invention.

Example 1

Figure 2:
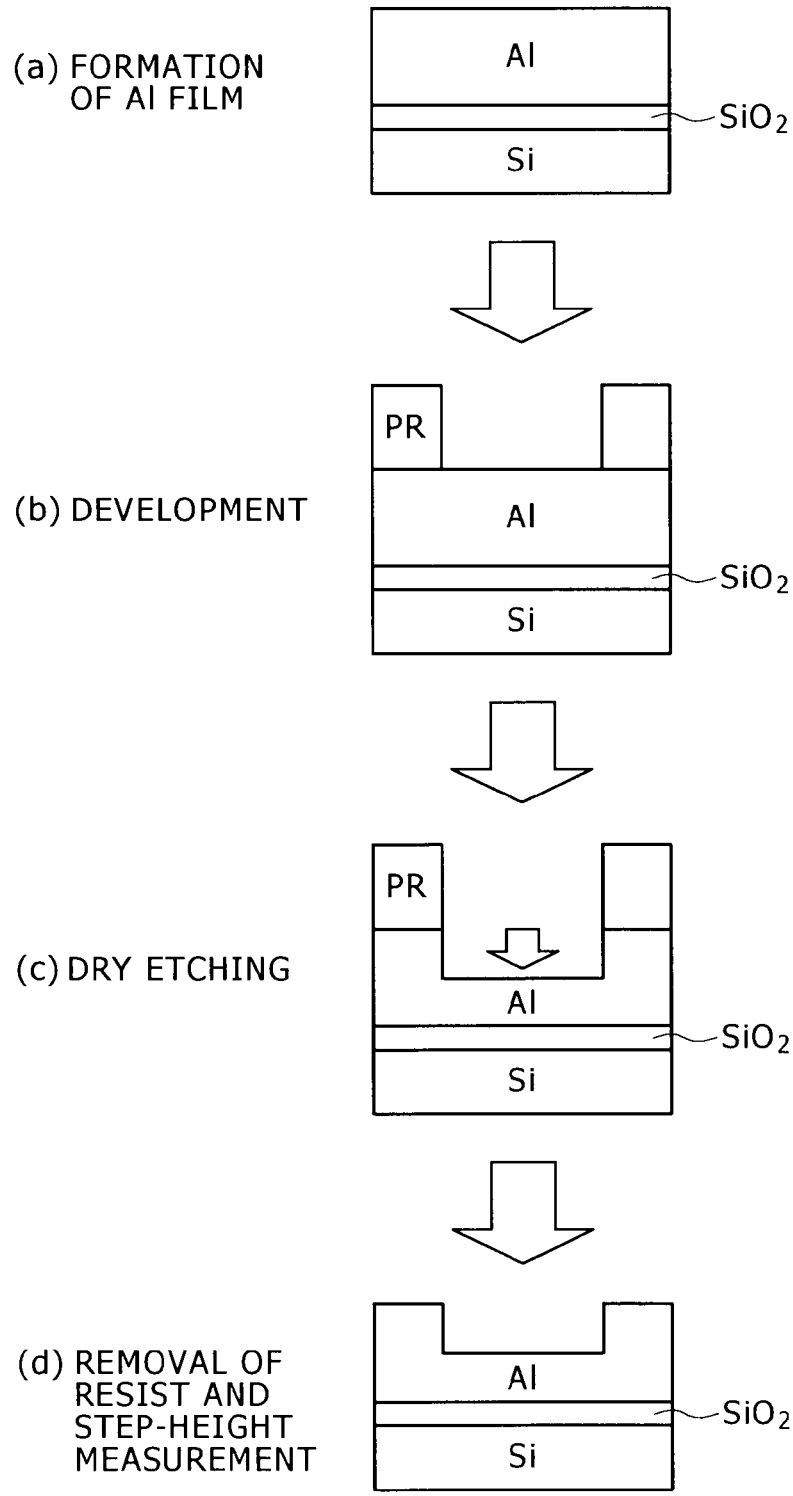
FIG. 2 shows the flow of the process of evaluation of etching rate according to Example 1, in which (a) is a side view showing a state that an oxide film and an Al alloy thin film are formed on the silicon substrate; (b) is a side view showing a state that a resist pattern is formed by applying, exposing and developing the resist by photolithography; (c) is a side view showing a state that dry etching of the Al alloy thin film is conducted by using the resist pattern as a mask; and (d) is a side view showing a state after the resist is removed.

The flow of the process of evaluation of etching rate according to Examples and Comparative Examples of the present invention is shown in FIG. 2. First, an oxide film (SiO) having a film thickness of 100 nm was formed on the silicon substrate by thermal oxidation. Second, an Al alloy thin film having a film thickness of 300 nm was formed on the oxide film by sputtering. (shown in FIG. 2($a$).) Subsequently, the resist was applied, exposed and developed by photolithography, thereby forming a resist pattern (PR). In forming the resist pattern, a tetramethylammonium hydroxide aqueous solution (TMAH) was used as the developer. (shown in FIG. 2($b$).)

Subsequently, dry etching of the Al alloy thin film using the resist pattern as a mask was conducted. The ICP (inductively coupled plasma) dry etching device described in Japanese Unexamined Patent Publication No. 2004-55842 was used for the dry etching. This plasma generating device described in Japanese Unexamined Patent Publication No. 2004-55842 is so-called TCP (Transfer-Coupled Plasma) type plasma process equipment (etcher) with a flat board type dielectric window. A single-turn 13.56 MHz RF antenna is placed on a flat-board like quartz dielectric window via a matching box, and high density plasma is produced by inductive coupling immediately below the quartz dielectric window. A substrate susceptor with a low frequency for bias at 400 kHz applied was used as a substrate susceptor on which a substrate is mounted. Etching was conducted using this device. The etching conditions were as follows: gas flow rate: $Ar/Cl_2/BCl_3$=300/200/60 sccm, gas pressure: 1.9 Pa, power applied to the antenna (source RF): 500 W, substrate bias: 60 W, substrate temperature (susceptor temperature): 20° C. (shown in FIG. 2($c$).)

After the etching, to prevent after-corrosion, i.e., corrosion of Al alloy wires caused by the generation of hydrochloric acid (HCl) due to the reaction between reaction products deposited on the resist with Al wire pattern and moisture in the air, the resist was removed by the ashing process with oxygen plasma in a multi-chamber process without releasing atmosphere from the chamber. (shown in FIG. 2($d$).) Such etching and after treatment were carried out to calculate the etching rate using the etching time as a factor.

The thus-obtained results are shown in Tables 1 and 2. The etching rate represents a ratio of the value obtained to that of a pure Al thin film (No. 1), and a value of 0.3 or higher was determined acceptable (○). Residues were observed at a plurality of portions on the surface of the oxide film after the Al alloy thin film was etched and further subjected to over-etching using a scanning electron microscope (SEM). The presence or absence of residues having a diameter of 0.3 μm or larger was determined, and samples with which no residues were found at any portion inspected were determined as acceptable (○). Moreover, samples which were determined as acceptable (○) for both criteria: etching rate and residues were determined as acceptable (○) in overall judgment. The term "at %" shown in Tables 1 and 2 means atom (also in Tables 3 and 4.)

(Summary of results obtained in Example 1)

Table 1 shows examples using Al alloy thin films comprising Si, Ni and La as source-drain electrodes. According to Table 1, Nos. 2 to 7, 9 to 11, 14, 15, 17, 18, 20, 21, 28 to 31, 37, 39 and 41 in which the component compositions of the Al alloy thin films (source-drain electrodes) satisfy requirement [1] of the present invention; Nos. 12, 13, 23, 24 and 32 to 34 in which the component compositions of the Al alloy thin films satisfy requirement [2] of the present invention; and, Nos. 8, 16 and 19 in which the component compositions of the Al alloy thin films satisfy requirement [3] of the present invention were acceptable (○) for both criteria: etching rate and residues, making them acceptable (○) in overall judgment. On the other hand, No. 22, to 27, 35, 36, 38, 40 and 42 to 45 in which the component compositions of the Al alloy thin films do not satisfy any of requirements [1] to [3] of the present invention were unacceptable (x) for at least one of the criteria: etching rate and residues, making them unacceptable (x) in overall judgment. In case of No. 1 where the source-drain electrodes were pure Al thin films, no residues were observed, making them acceptable (○) in overall judgment.

Table 2 shows the examples using the Al alloy thin films comprising Ge, Co and La as the source-drain electrodes. Nos. 46 to 65 shown in Table 2 satisfy all of requirements [1] to [3] of the present invention, and therefore were acceptable (○) for both criteria: etching rate and residues, making them acceptable (○) in overall judgment.

Examples using the Al alloy thin films comprising Si, Co and La as the source-drain electrodes, and examples using the Al alloy thin films comprising Ge, Ni and La as the source-drain electrodes are not shown, but it is obvious that test results similar to those in Tables 1 and 2 are obtained.

TABLE 1

| No. | Source-drain electrodes | Dry etching Rate | Residues | Overall judgment |
|---|---|---|---|---|
| 1 | Al | 1.00 | ○ | ○ |
| 2 | Al—0.5 at % Si—0.2 at % Ni—0.1 at % La | 0.94 | ○ | ○ |
| 3 | Al—0.5 at % Si—0.6 at % Ni—0.1 at % La | 0.90 | ○ | ○ |
| 4 | Al—0.3at % Si—0.6 at % Ni—0.1 at % La | 0.95 | ○ | ○ |
| 5 | Al—0.5 at % Si—0.6 at % Ni—0.1 at % La | 0.90 | ○ | ○ |
| 6 | Al—1.0 at % Si—0.6 at % Ni—0.1 at % La | 0.76 | ○ | ○ |
| 7 | Al—1.5 at % Si—0.6 at % Ni—0.1 at % La | 0.64 | ○ | ○ |
| 8 | Al—2.0 at % Si—0.6 at % Ni—0.1 at % La | 0.50 | ○ | ○ |
| 9 | Al—0.5 at % Si—1.0 at % Ni—0.1 at % La | 0.85 | ○ | ○ |
| 10 | Al—0.5 at % Si—2.0 at % Ni—0.1 at % La | 0.73 | ○ | ○ |
| 11 | Al—0.5 at % Si—3.0 at % Ni—0.1 at % La | 0.61 | ○ | ○ |
| 12 | Al—0.5 at % Si—4.0 at % Ni—0.1 at % La | 0.50 | ○ | ○ |
| 13 | Al—0.5 at % Si—5.0 at % Ni—0.1 at % La | 0.36 | ○ | ○ |
| 14 | Al—1.0 at % Si—1.0 at % Ni—0.1 at % La | 0.71 | ○ | ○ |

TABLE 1-continued

|  |  | Dry etching |  | Overall |
|---|---|---|---|---|
| No. | Source-drain electrodes | Rate | Residues | judgment |
| 15 | Al—1.5 at % Si—1.0 at % Ni—0.1 at % La | 0.57 | ○ | ○ | ○ |
| 16 | Al—2.0 at % Si—1.0 at % Ni—0.1 at % La | 0.45 | ○ | ○ | ○ |
| 17 | Al—1.0 at % Si—2.0 at % Ni—0.1 at % La | 0.61 | ○ | ○ | ○ |
| 18 | Al—1.5 at % Si—2.0 at % Ni—0.1 at % La | 0.47 | ○ | ○ | ○ |
| 19 | Al—2.0 at % Si—2.0 at % Ni—0.1 at % La | 0.35 | ○ | ○ | ○ |
| 20 | Al—1.0 at % Si—3.0 at % Ni—0.1 at % La | 0.53 | ○ | ○ | ○ |
| 21 | Al—1.5 at % Si—3.0 at % Ni—0.1 at % La | 0.40 | ○ | ○ | ○ |
| 22 | Al—2.0 at % Si—3.0 at % Ni—0.1 at % La | 0.27 | x | ○ | x |
| 23 | Al—1.0 at % Si—4.0 at % Ni—0.1 at % La | 0.47 | ○ | ○ | ○ |
| 24 | Al—1.5 at % Si—4.0 at % Ni—0.1 at % La | 0.33 | ○ | ○ | ○ |
| 25 | Al—2.0 at % Si—4.0 at % Ni—0.1 at % La | 0.21 | x | ○ | x |
| 26 | Al—2.0 at % Si—5.0 at % Ni—0.1 at % La | 0.18 | x | x | x |
| 27 | Al—2.0 at % Si—6.0 at % Ni—0.1 at % La | 0.16 | x | x | x |
| 28 | Al—0.5 at % Si—1.0 at % Ni—0.35 at % La | 0.78 | ○ | ○ | ○ |
| 29 | Al—0.5 at % Si—2.0 at % Ni—0.35 at % La | 0.70 | ○ | ○ | ○ |
| 30 | Al—1.5 at % Si—2.0 at % Ni—0.35 at % La | 0.45 | ○ | ○ | ○ |
| 31 | Al—1.5 at % Si—3.0 at % Ni—0.35 at % La | 0.38 | ○ | ○ | ○ |
| 32 | Al—1.5 at % Si—4.0 at % Ni—0.35 at % La | 0.35 | ○ | ○ | ○ |
| 33 | Al—1.5 at % Si—5.0 at % Ni—0.35 at % La | 0.32 | ○ | ○ | ○ |
| 34 | Al—1.5 at % Si—6.0 at % Ni—0.35 at % La | 0.30 | ○ | ○ | ○ |
| 35 | Al—2.0 at % Si—6.0 at % Ni—0.35 at % La | 0.25 | x | x | x |
| 36 | Al—1.5 at % Si—7.0 at % Ni—0.35 at % La | 0.26 | x | x | x |
| 37 | Al—1.5 at % Si—2.0 at % Ni—0.5 at % La | 0.36 | ○ | ○ | ○ |
| 38 | Al—2.0 at % Si—2.0 at % Ni—0.5 at % La | 0.24 | x | ○ | x |
| 39 | Al—1.5 at % Si—2.0 at % Ni—0.5 at % La | 0.31 | ○ | ○ | ○ |
| 40 | Al—2.0 at % Si—2.0 at % Ni—1.0 at % La | 0.17 | x | ○ | x |
| 41 | Al—1.5 at % Si—3.0 at % Ni—0.5 at % La | 0.32 | ○ | ○ | ○ |
| 42 | Al—2.0 at % Si—3.0 at % Ni—0.5 at % La | 0.18 | x | ○ | x |
| 43 | Al—1.5 at % Si—3.0 at % Ni—1.0 at % La | 0.25 | x | ○ | x |
| 44 | Al—2.0 at % Si—3.0 at % Ni—1.0 at % La | 0.13 | x | ○ | x |
| 45 | Al—2.0 at % Si—3.0 at % Ni—1.5 at % La | 0.09 | x | x | x |

TABLE 2

|  |  | Dry etching |  |  |
|---|---|---|---|---|
| No | Source-drain electrodes | Rate | Residues | Judgment |
| 1 | Al | 1 | ○ | ○ | ○ |
| 46 | Al—0.3 at % Ge—0.2 at % Co—0.2 at % La | 0.93 | ○ | ○ | ○ |
| 47 | Al—0.5 at % Ge—0.2 at % Co—0.2 at % La | 0.91 | ○ | ○ | ○ |
| 48 | Al—0.8 at % Ge—0.2 at % Co—0.2 at % La | 0.87 | ○ | ○ | ○ |
| 49 | Al—1.0 at % Ge—0.2 at % Co—0.2 at % La | 0.84 | ○ | ○ | ○ |
| 50 | Al—1.2 at % Ge—0.2 at % Co—0.2 at % La | 0.78 | ○ | ○ | ○ |
| 51 | Al—0.3 at % Ge—0.4 at % Co—0.2 at % La | 0.9 | ○ | ○ | ○ |
| 52 | Al—0.5 at % Ge—0.4 at % Co—0.2 at % La | 0.88 | ○ | ○ | ○ |
| 53 | Al—0.8 at % Ge—0.4 at % Co—0.2 at % La | 0.84 | ○ | ○ | ○ |
| 54 | Al—1.0 at % Ge—0.4 at % Co—0.2 at % La | 0.81 | ○ | ○ | ○ |
| 55 | Al—1.2 at % Ge—0.4 at % Co—0.2 at % La | 0.75 | ○ | ○ | ○ |
| 56 | Al—0.3 at % Ge—0.6 at % Co—0.2 at % La | 0.86 | ○ | ○ | ○ |
| 57 | Al—0.5 at % Ge—0.6 at % Co—0.2 at % La | 0.84 | ○ | ○ | ○ |
| 58 | Al—0.8 at % Ge—0.6 at % Co—0.2 at % La | 0.8 | ○ | ○ | ○ |
| 59 | Al—1.0 at % Ge—0.6 at % Co—0.2 at % La | 0.77 | ○ | ○ | ○ |
| 60 | Al—1.2 at % Ge—0.6 at % Co—0.2 at % La | 0.71 | ○ | ○ | ○ |
| 61 | Al—0.3 at % Ge—1.0 at % Co—0.2 at % La | 0.75 | ○ | ○ | ○ |
| 62 | Al—0.5 at % Ge—1.0 at % Co—0.2 at % La | 0.73 | ○ | ○ | ○ |
| 63 | Al—0.8 at % Ge—1.0 at % Co—0.2 at % La | 0.69 | ○ | ○ | ○ |
| 64 | Al—1.0 at % Ge—1.0 at % Co—0.2 at % La | 0.66 | ○ | ○ | ○ |
| 65 | Al—1.2 at % Ge—1.0 at % Co—0.2 at % La | 0.6 | ○ | ○ | ○ |

Example 2-1

Elements for evaluation (pn junction devices) according to Examples and Comparative Examples of the present invention were prepared. The flow of this process is shown in FIG. 3. First, polycrystalline silicon films having a film thickness of 200 nm were formed on p-type low-resistance silicon substrates by the LPCVD method. (shown in FIG. 3(a).) At this time, $SiH_4$ was used as a raw material gas. Second, $BF_2^+$ ions were injected under the conditions of 10 keV and 3 $e^{15}/cm^2$. (shown in FIG. 3(b).) Subsequently, a heat treatment at 800° C. was carried out for 30 minutes after this injection of ions, forming p-doped polycrystalline silicon films. (shown in FIG. 3(c).) Furthermore, n-doped polycrystalline silicon films having a film thickness of about 40 nm were formed on these p-type polycrystalline silicon films. (shown in FIG. 3(d).) At this time, $SiH_4$ and $PH_3$ were used as doping gases in the film forming. Accordingly, pn junctions of polycrystalline silicon were formed.

Al alloy thin films having a film thickness of about 300 nm were formed on these polycrystalline silicon films by sputtering. Subsequently, resist patterns were formed by photolithography, and then etching of the Al alloy thin films was carried out using resists as masks, forming elements for evaluation shown in FIG. 3(e). (shown in FIG. 3(e).) The compositions of these Al alloy thin films areas shown in the column of the source-drain electrodes in Tables 3 and 4. In the elements for evaluation shown in FIG. 3(e), the Al alloy thin films correspond to the source-drain electrodes, while the n-type polycrystalline silicon films and p-type polycrystalline silicon films therebelow correspond to the semiconductor layers of the thin film transistors. The source-drain electrodes (Al alloy thin films) and the semiconductor layers of the thin film transistors have a structure in which they are directly connected without a barrier metal lying therebetween.

The thus prepared elements for evaluation (pn junction device) were subjected to a heat treatment at a temperature of 250 to 400° C. for 30 minutes. the pn junction devices after the heat treatment were determined for their current voltage characteristics to determine the degree of interdiffusion of Al atoms and Si atoms. That is, the diffusion phenomenon of the Si atoms in polycrystalline silicon (semiconductor layer) and the Al atoms in the Al alloy film (source-drain electrodes) can be evaluated by determining the current voltage characteristics of the pn junction device. An element having a normal pn junction has such a rectification property that a current is flown by applying a negative voltage to the n-type region and a positive voltage (positive bias) to the p-type region, while on the other hand a current is shut off by applying a positive voltage to the n-type region and a negative voltage (reverse bias) to the p-type region. However, when Al atoms diffuse from the Al alloy thin film (source-drain electrodes) into the pn junction region, a normal rectification property cannot be obtained. That is, a current cannot be shut off even when a reverse bias is applied. Therefore, the influence of the interdiffusion of Al atoms and Si atoms can be grasped by evaluating the magnitude of a current (leakage current) which flows when a reverse bias is applied. To this end, the value of this leakage current was determined, and the degree of interdiffusion of Al atoms and Si atoms was evaluated from the measurement value of this leakage current. The size of the elements evaluated was such that they each have a pn junction area of 30 $\mu$m×30 $\mu$m, and a current value when a voltage of +1 V is applied to this as a reverse bias was defined as a leakage current.

The results of this are shown in the column of interdiffusion in Tables 3 and 4. A leakage current of the element in which Cr was placed as a barrier metal between the source-drain electrodes (Al alloy thin film) and the semiconductor layer of the thin film transistor was $4.0\times10^{-9}$ A. A leakage current lower than a value 10 times higher than this value ($4.0\times10^{-8}$ A) was determined as ○, while a leakage current higher than the value was determined as x in Tables 3 and 4. That is, elements with leakage current of $4.0\times10^{-8}$ A or lower were judged good, while elements with a leakage current higher than $4.0\times10^{-8}$ A were judged poor.

The generation of hillock due to the heat treatment was evaluated in the following manner. Wiring of the line and space pattern having a width of 10 $\mu$m was formed on the above-mentioned sample of a pn junction device, and the device was subjected to a vacuum heat treatment at 350° C. for 30 minutes. Thereafter, the surface of the wiring was observed by an electronic microscope to count the number of hillocks having a diameter of 0.1 $\mu$m or larger. Samples with the density of hillocks of $1\times10^9/m^2$ or fewer were judged good (○), while those with the density of hillock more than $1\times10^9/m^2$ were judged poor (x). The results of this observation are shown in the column of hillock resistance in Tables 3 and 4.

Example 2-2

Al alloy thin films having a film thickness of 300 nm were formed on glass substrates by sputtering. Subsequently, resist patterns were formed by photolithography, and then etching of the Al alloy thin films was carried out using resists as masks to process them to give a stripe pattern configuration having a width of 100 $\mu$m and a length of 10 mm. The composition of these Al alloy thin films are also as shown in the column of the source-drain electrodes in Table 2

The Al alloy films after the etching mentioned above were subjected to a heat treatment at a temperature of 250 to 400° C. for 30 minutes. These Al alloy thin films after the heat treatment were determined for their electric resistivity by the four-terminal method. The results of this determination are shown in the column of electric resistivity in Tables 3 and 4. The electric resistivity (4.3 $\mu\Omega$cm) about 1.3 times higher than the electric resistivity of a pure Al thin film (3.3 $\mu\Omega$cm) was used as a reference value. Samples having an electric resistivity equal to or lower than this reference value were judged good, while those which were not were judged poor.

Example 2-3

The contact properties (contact resistance) when the Al alloy electrodes and the transparent conductive film are directly connected were determined. Samples in which ITO films were formed on various Al alloy electrodes shown in Tables 3 and 4 were formed under an atmosphere of Ar gas, at a pressure of 0.4 Pa and a temperature of 200° C. The ITO films used were prepared by adding 10% by mass of tin oxide to indium oxide.

Contact resistivities were determined by producing a Kelvin pattern having 10-$\mu$m square contact holes and by the four-terminal method. Using the contact resistivity of a Cr thin film and ITO, $2\times10^{-4}$ $\Omega$cm as a reference value, samples having a contact resistivity equal to or lower than this reference value were judged good (○), while those which did not were judged poor (x). The evaluation results are shown in Tables 3 and 4.

Although the numbers of Examples and Comparative Examples shown in Tables 3 and 4 do not conform to those of Examples and Comparative Examples shown in Tables 1 and 2 in terms of the component compositions of the source-drain electrodes, the numbers corresponding to those in Tables 1 and 2 are shown as corresponding numbers in Tables 3 and 4. When there is no corresponding Examples and Comparative Examples in Tables 1 and 2, they are indicated with "–".

(Summary of the Results Obtained in Examples 2-1 to 2-3)

Table 3 shows examples using an Al alloy thin film comprising Si, Ni or La as source-drain electrodes. According to Table 3, in Example 2, Nos. 3 to 8, 10, 11 and 13 to 22 are Examples in which the component compositions of the Al alloy thin films (source-drain electrodes) satisfy the requirement [1] of the present invention, while the rest Nos. 9 and 12 are examples in which the component compositions of the Al alloy thin films satisfy requirement [3] of the present invention. (Nos. 15 to 18 and 20 also satisfy requirement [2] of the present invention.) As a result, Nos. 3 to 22 which are Examples of the present invention were good in all of the criteria: leakage current, hillock resistance, electric resistivity and contact resistance, making them acceptable (○) in overall judgment. On the other hand, in case of No. 1 where the source-drain electrodes were pure Al thin films, good results could not be obtained in leakage current, hillock resistance and contact resistance. No. 2, in which Cr was placed as a barrier metal between the source-drain electrodes (Al alloy thin film) and the semiconductor layer of the thin film transistors, also exhibited poor electric resistivity. Therefore, both Nos. 1 and 2 were unacceptable (x) in overall judgment.

Table 4 shows the examples using the Al alloy thin films comprising Ge, Co and La as the source-drain electrodes. Since Nos. 23 to 37 shown in Table 4 satisfy all of requirements [1] to [3] of the present invention, they were judged good in all the criteria: leakage current, hillock resistance, electric resistivity and contact resistance, making them acceptable (○) in overall judgment.

Although Examples using the Al alloy thin films comprising Si, Co and La as the source-drain electrodes, and Example using the Al alloy thin films comprising Ge, Ni and La as the source-drain electrodes are not shown, it is obvious that test results similar to those in Tables 3 and 4 can be obtained.

TABLE 3

| No. | Corresponding No | Source-drain electrodes | Leakage current (A) @250° C. | Leakage current (A) @400° C. | Interdiffusion @250° C. | Interdiffusion @400° C. | Hillock resistance @400° C. | Electric resistivity @350° C. | Contact resistivity ($\Omega cm^2$) | Overall judgment |
|---|---|---|---|---|---|---|---|---|---|---|
| 1 | 1 | Al | 3.50E−04 | >1E−02 | x | x | x | 3.3 | 1.00E−03 | x |
| 2 | — | Cr | 3.20E−09 | 4.00E−09 | ○ | ○ | ○ | 14.3 | 2.00E−04 | x |
| 3 | 2 | Al—0.5 at % Si—0.2 at % Ni—0.1 at % La | 4.80E−09 | 3.50E−08 | ○ | ○ | ○ | 3.6 | 1.80E−04 | ○ |
| 4 | 4 | Al—0.3 at % Si—0.6 at % Ni—0.1 at % La | 5.20E−09 | 3.80E−08 | ○ | ○ | ○ | 3.6 | 1.50E−04 | ○ |
| 5 | 5 | Al—0.5 at % Si—0.6 at % Ni—0.1 at % La | 4.40E−09 | 3.10E−08 | ○ | ○ | ○ | 3.7 | 1.50E−04 | ○ |
| 6 | 6 | Al—1.0 at % Si—0.6 at % Ni—0.1 at % La | 2.20E−09 | 1.30E−08 | ○ | ○ | ○ | 3.7 | 1.40E−04 | ○ |
| 7 | 9 | Al—0.5 at % Si—1.0 at % Ni—0.1 at % La | 5.20E−09 | 3.10E−08 | ○ | ○ | ○ | 3.7 | 8.00E−05 | ○ |
| 8 | 14 | Al—1.0 at % Si—1.0 at % Ni—0.1 at % La | 9.50E−10 | 2.90E−09 | ○ | ○ | ○ | 3.7 | 9.00E−05 | ○ |
| 9 | 16 | Al—2.0 at % Si—1.0 at % Ni—0.1 at % La | 6.60E−11 | 1.50E−10 | ○ | ○ | ○ | 3.8 | 1.10E−04 | ○ |
| 10 | 10 | Al—0.5 at % Si—2.0 at % Ni—0.1 at % La | 3.30E−09 | 1.50E−08 | ○ | ○ | ○ | 3.8 | 5.00E−05 | ○ |
| 11 | 17 | Al—1.0 at % Si—2.0 at % Ni—0.1 at % La | 7.30E−10 | 1.40E−09 | ○ | ○ | ○ | 3.9 | 5.00E−05 | ○ |
| 12 | 19 | Al—2.0 at % Si—2.0 at % Ni—0.1 at % La | 4.10E−11 | 1.10E−10 | ○ | ○ | ○ | 4.0 | 8.00E−05 | ○ |
| 13 | 11 | Al—0.5 at % Si—3.0 at % Ni—0.1 at % La | 1.60E−09 | 9.20E−09 | ○ | ○ | ○ | 4.0 | 3.00E−05 | ○ |
| 14 | 20 | Al—1.0 at % Si—3.0 at % Ni—0.1 at % La | 5.10E−10 | 1.00E−09 | ○ | ○ | ○ | 4.1 | 3.00E−05 | ○ |
| 15 | — | Al—0.5 at % Si—1.0 at % Ni—0.25 at % La | 5.60E−09 | 3.30E−08 | ○ | ○ | ○ | 4.3 | 7.00E−05 | ○ |
| 16 | — | Al—1.0 at % Si—1.0 at % Ni—0.25 at % La | 1.30E−09 | 3.10E−09 | ○ | ○ | ○ | 3.8 | 8.00E−05 | ○ |
| 17 | — | Al—0.5 at % Si—1.5 at % Ni—0.25 at % La | 4.50E−09 | 2.05−08 | ○ | ○ | ○ | 3.8 | 6.00E−05 | ○ |
| 18 | — | Al—1.0 at % Si—1.5 at % Ni—0.25 at % La | 9.50E−10 | 1.80E−08 | ○ | ○ | ○ | 3.9 | 7.00E−05 | ○ |
| 19 | 28 | Al—0.5 at % Si—1.0 at % Ni—0.35 at % La | 7.10E−09 | 3.70E−08 | ○ | ○ | ○ | 3.8 | 6.50E−05 | ○ |
| 20 | — | Al—1.0 at % Si—1.0 at % Ni—0.35 at % La | 2.20E−09 | 3.80E−09 | ○ | ○ | ○ | 3.9 | 7.50E−05 | ○ |
| 21 | — | Al—0.5 at % Si—1.0 at % Ni—0.5 at % La | 6.20E−09 | 3.30E−08 | ○ | ○ | ○ | 3.8 | 8.00E−05 | ○ |
| 22 | — | Al—1.0 at % Si—1.0 at % Ni—0.5 at % La | 1.10E−09 | 4.90E−09 | ○ | ○ | ○ | 3.9 | 1.00E−04 | ○ |

(Remarks) In the above table, the phrase "E−X (X: integer)" means "$10^{-X}$"

TABLE 4

| No. | Corresponding No | Source-drain electrodes | Leakage current (A) @250° C. | Leakage current (A) @400° C. | Interdiffusion @250° C. | Interdiffusion @400° C. | Hillock resistance @400° C. | Electric resistivity @350° C. ($\mu\Omega cm$) | Contact resistivity ($\Omega cm^2$) | Overall judgment |
|---|---|---|---|---|---|---|---|---|---|---|
| 1 | 1 | Al | 3.50E−04 | >1E−02 | x | x | x | 3.3 | 1.00E−03 | x |
| 2 | — | Cr | 3.20E−09 | 4.00E−09 | ○ | ○ | ○ | 14.3 | 2.00E−04 | x |
| 23 | 46 | Al—0.3 at % Ge—0.2 at % Co—0.2 at % La | 7.00E−09 | 3.90E−08 | ○ | ○ | ○ | 3.4 | 8.00E−05 | ○ |
| 24 | 47 | Al—0.5 at % Ge—0.2 at % Co—0.2 at % La | 6.50E−09 | 3.70E−08 | ○ | ○ | ○ | 3.5 | 5.00E−05 | ○ |
| 25 | 48 | Al—0.8 at % Ge—0.2 at % Co—0.2 at % La | 4.80E−09 | 3.10E−08 | ○ | ○ | ○ | 3.7 | 4.70E−05 | ○ |
| 26 | 49 | Al—1.0 at % Ge—0.2 at % Co—0.2 at % La | 3.50E−09 | 2.00E−08 | ○ | ○ | ○ | 4 | 4.00E−05 | ○ |

TABLE 4-continued

| No. | Corresponding No | Source-drain electrodes | Leakage current (A) @250° C. | Leakage current (A) @400° C. | Interdiffusion @250° C. | Interdiffusion @400° C. | Hillock resistance @400° C. | Electric resistivity @350° C. (μΩcm) | Contact resistivity (Ωcm²) | Overall judgment |
|---|---|---|---|---|---|---|---|---|---|---|
| 27 | 50 | Al—1.2 at % Ge—0.2 at % Co—0.2 at % La | 2.90E−09 | 1.70E−08 | ○ | ○ | ○ | 4.2 | 4.10E−05 | ○ |
| 28 | 56 | Al—0.3 at % Ge—0.6 at % Co—0.2 at % La | 5.10E−09 | 3.50E−08 | ○ | ○ | ○ | 3.8 | 6.00E−05 | ○ |
| 29 | 57 | Al—0.5 at % Ge—0.6 at % Co—0.2 at % La | 4.60E−09 | 3.40E−08 | ○ | ○ | ○ | 3.9 | 4.00E−05 | ○ |
| 30 | 58 | Al—0.8 at % Ge—0.6 at % Co—0.2 at % La | 4.00E−09 | 2.70E−08 | ○ | ○ | ○ | 4.1 | 3.60E−05 | ○ |
| 31 | 59 | Al—1.0 at % Ge—0.6 at % Co—0.2 at % La | 2.20E−09 | 1.30E−08 | ○ | ○ | ○ | 4.3 | 3.20E−05 | ○ |
| 32 | 60 | Al—1.2 at % Ge—0.6 at % Co—0.2 at % La | 1.90E−09 | 1.00E−08 | ○ | ○ | ○ | 4.5 | 3.10E−05 | ○ |
| 33 | 61 | Al—0.3 at % Ge—1.0 at % Co—0.2 at % La | 4.10E−09 | 2.50E−08 | ○ | ○ | ○ | 4.2 | 4.00E−05 | ○ |
| 34 | 62 | Al—0.5 at % Ge—1.0 at % Co—0.2 at % La | 3.00E−09 | 2.00E−08 | ○ | ○ | ○ | 4.3 | 3.00E−05 | ○ |
| 35 | 63 | Al—0.8 at % Ge—1.0 at % Co—0.2 at % La | 2.30E−09 | 9.00E−09 | ○ | ○ | ○ | 4.5 | 2.70E−05 | ○ |
| 36 | 64 | Al—1.0 at % Ge—1.0 at % Co—0.2 at % La | 1.80E−09 | 5.00E−09 | ○ | ○ | ○ | 4.6 | 2.60E−05 | ○ |
| 37 | 65 | Al—1.2 at % Ge—1.0 at % Co—0.2 at % La | 1.40E−09 | 2.20E−09 | ○ | ○ | ○ | 4.8 | 2.50E−05 | ○ |

(Remarks) In the above table, the phrase "E−X (X: integer)" means "$10^{-X}$"

(Overall Evaluation of Examples 1 and 2)

When the component compositions of the Al alloy thin films (source-drain electrodes) satisfy any of requirements [1] to [3] of the present invention, both Examples 1 and 2 were judged acceptable (○) in overall judgment, and can be therefore used as source electrodes and drain electrodes with good basic performance, without causing a decrease in the dry etching rate of the source electrodes and drain electrodes or generating etching residue. On the other hand, when the component compositions of the Al alloy thin films (source-drain electrodes) do not satisfy any of requirements [1] to [3] of the present invention; when pure Al thin films are used as the source-drain electrodes; or when Cr was placed as a barrier metal between the source-drain electrodes (Al alloy thin film) and the semiconductor layer of the thin film transistors, the overall judgment was unacceptable (x) at least for either of Examples 1 and 2, and therefore the object of the present invention cannot be achieved.

Although the present invention has been described in detail with reference to the specific embodiments, it is apparent for a person of skill in the art that various changes and modifications can be made without departing from the spirit and scope of the present invention.

The present application is based on Japanese Patent Application (No. 2008-007221-A) applied on Jan. 16, 2008 and Japanese Patent Application (No. 2009-003732-A) applied on Jan. 9, 2009, and their contents are hereby incorporated by reference.

INDUSTRIAL APPLICABILITY

The present invention relates to the technical field of thin film transistor substrates and display devices. According to the present invention, a decrease in the dry etching rate of the source electrode and drain electrode is prevented; no etching residue is generated; and a barrier metal can be eliminated from between the semiconductor layer of the thin film transistor and the metal wires such as the source electrode and drain electrode. Moreover, a barrier metal existing between the drain electrode and the transparent conductive film can be also eliminated.

The invention claimed is:

1. A thin film transistor substrate having a semiconductor layer of a thin film transistor, a source electrode, a drain electrode, and a transparent conductive film,
   the source electrode and drain electrode comprising a thin film of Al alloy formed by patterning by dry etching, the thin film of Al alloy comprising 0.1 to 1.5 atom % of Ge, 0.1 to 3.0 atom % of at least one element selected from Ni and Co, and 0.1 to 0.5 atom % of at least one element selected from La and Nd,
   the source electrode and drain electrode being directly connected with the semiconductor layer comprising polycrystalline silicon or continuous grain polycrystalline silicon;
   wherein the ratio of the dry etching rate of the thin film of Al alloy to the dry etching rate of a thin film of pure Al is a value of 0.3 or higher.

2. A thin film transistor substrate having a semiconductor layer of a thin film transistor, a source electrode, a drain electrode, and a transparent conductive film, μ
   the source electrode and drain electrode comprising a thin film of Al alloy formed by patterning by dry etching, the thin film of Al alloy comprising 0.1 to 1.5 atom % of Ge, 0.1 to 6.0 atom % of at least one element selected from Ni and Co, and 0.1 to 0.35 atom % of at least one element selected from La and Nd, and
   the source electrode and drain electrode being directly connected with a semiconductor layer comprising polycrystalline silicon or continuous grain polycrystalline silicon;
   wherein the ratio of the dry etching rate of the thin film of Al alloy to the dry etching rate of a thin film of pure Al is a value of 0.3 or higher.

3. A thin film transistor substrate having a semiconductor layer of a thin film transistor, a source electrode, a drain electrode, and a transparent conductive film, the source electrode and drain electrode comprising a thin film of Al alloy formed by patterning by dry etching, the thin film of Al alloy comprising 0.1 to 2.0 atom % of Ge, 0.1 to 2.0 atom % of at least one element selected from Ni and Co, and 0.1 to 0.25 atom % of at least one element selected from La and Nd, and the source electrode and drain electrode being directly connected with a semiconductor layer comprising polycrystalline silicon or continuous grain polycrystalline silicon;

wherein the ratio of the dry etching rate of the thin film of Al alloy to the dry etching rate of a thin film of pure Al is a value of 0.3 or higher.

4. A thin film transistor substrate according to claim 1, wherein the drain electrode is further directly connected with the transparent conductive film.

5. A thin film transistor substrate according to claim 1, wherein the source electrode and the drain electrode are formed by dry etching using an etchant gas comprising at least one gas selected from chlorine ($Cl_2$), boron trichloride ($BCl_3$), and hydrogen bromide (HBr).

6. A thin film transistor substrate according to claim 5, wherein the source electrode and the drain electrode are formed during photolithography development prior to dry etching by being exposed to a tetramethylammonium hydroxide aqueous solution at the surfaces thereof.

7. A thin film transistor substrate according to claim 1, wherein the thin film of Al alloy comprises 0.1 to 1.5 atom % of Ge, 0.1 to 3.0 atom % of Co, and 0.1 to 0.5 atom % of at least one element selected from La and Nd.

8. A thin film transistor substrate according to claim 2, wherein the drain electrode is further directly connected with the transparent conductive film.

9. A thin film transistor substrate according to claim 2, wherein the source electrode and the drain electrode are formed by dry etching using an etchant gas comprising at least one gas selected from chlorine ($Cl_2$), boron trichloride ($BCl_3$), and hydrogen bromide (HBr).

10. A thin film transistor substrate according to claim 9, wherein the source electrode and the drain electrode are formed during photolithography development prior to dry etching by being exposed to a tetramethylammonium hydroxide aqueous solution at the surfaces thereof.

11. A thin film transistor substrate according to claim 2, wherein the thin film of Al alloy comprises 0.1 to 1.5 atom % of Ge, 0.1 to 6.0 atom % of Co, and 0.1 to 0.35 atom % of at least one element selected from La and Nd.

12. A thin film transistor substrate according to claim 3, wherein the drain electrode is further directly connected with the transparent conductive film.

13. A thin film transistor substrate according to claim 3, wherein the source electrode and the drain electrode are formed by dry etching using an etchant gas comprising at least one gas selected from chlorine ($Cl_2$), boron trichloride ($BCl_3$), and hydrogen bromide (HBr).

14. A thin film transistor substrate according to claim 13, wherein the source electrode and the drain electrode are formed during photolithography development prior to dry etching by being exposed to a tetramethylammonium hydroxide aqueous solution at the surfaces thereof.

15. A thin film transistor substrate according to claim 3, wherein the thin film of Al alloy comprises 0.1 to 2.0 atom % of Ge, 0.1 to 2.0 atom % of Co, and 0.1 to 0.25 atom % of at least one element selected from La and Nd display.

\* \* \* \* \*